(12) United States Patent
Kaczer et al.

(10) Patent No.: US 8,062,962 B2
(45) Date of Patent: Nov. 22, 2011

(54) METHOD FOR ENHANCING THE RELIABILITY OF A P-CHANNEL SEMICONDUCTOR DEVICE AND A P-CHANNEL SEMICONDUCTOR DEVICE MADE THEREOF

(75) Inventors: Benjamin Kaczer, Leuven (BE); Jacopo Franco, Leuven (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 12/903,040

(22) Filed: Oct. 12, 2010

(65) Prior Publication Data

US 2011/0084309 A1 Apr. 14, 2011

Related U.S. Application Data

(60) Provisional application No. 61/250,409, filed on Oct. 9, 2009.

(51) Int. Cl.
*H01L 29/78* (2006.01)
*H01L 21/30* (2006.01)
(52) U.S. Cl. . 438/479; 438/199; 438/478; 257/E23.211; 257/E29.255
(58) Field of Classification Search .................. 438/199, 438/478, 479; 257/192
See application file for complete search history.

(56) References Cited

OTHER PUBLICATIONS

Aoulaiche et al., Negative Bias Temperature Instability on Si-passivated GE-interface, IEEE International Reliability Physics Symposium (IRPS), p. 358-362 (2008).

Franco et al., Improvements of NBTI Reliability in SiGe p-FETs, International Reliability Physics Symposium (IRPS), p. 1082-1085 (2010).
Grasser et al., A Two-Stage Model for Negative Bias Temperature Instability, International Reliability Physics Symposium (IRPS), p. 33-44 (2009).
Kaczer et al., NBTI from the perspective of defect states with widely distributed time scales, International Reliability Physics Symposium (IRPS), p. 55-60 (2009).
Kaczer et al., Ubiquitous Relaxation in BTI Stressing—New Evaluation and Insights, IEEE 46th Annual International Reliability Physics Symposium, Phoenix, AZ p. 20-27 (2008).
Lee, et al., Demonstration of Lg~55 nm pMOSFETs With $Si/Si_{0.25}GE_{0.75}/Si$ Channels, High $I_{on}/I_{off}$ ($>5\times10^4$), and Controlled Short Channel Effects (SCEs), IEEE Electron Device Letters, vol. 29, No. 9, p. 1017-1020, Sep. 2008.
Morshed et al., Physics-based 1/f noise model for MOSFETs with nitrided high-k gate dielectrics, Elsevier Solid-State Electronics, vol. 52, p. 711-724 (2008).
European Search Report mailed on Jan. 31, 2011 in European Patent Application No. 10186985.7.

*Primary Examiner* — Alexander Ghyka
(74) *Attorney, Agent, or Firm* — Knobbe Martens Olson & Bear LLP

(57) ABSTRACT

A method for forming a semiconductor device is disclosed. The device includes a control electrode on a semiconductor P-channel layer having at least a gate dielectric layer. The gate dielectric layer has an exponentially decreasing density of defect levels $E_t$ in as function of energy from the band edges of the adjacent layer (the semiconductor P-channel layer or optionally the capping layer) toward the center of the bandgap of this layer. The method includes selecting at least one parameter of the P-channel semiconductor device such that the inversion carrier injection into the distribution of defect levels deviates from the energy level at the center of the bandgap of a layer adjacent the gate dielectric layer at the same side of the gate dielectric layer as the P-channel layer, with a value not more than about 49%, such as not more than about 40%, for example not more than about 20%, not more than about 10%, even not more than about 5% of that bandgap in eV. In one aspect, this allows reducing NBTI.

20 Claims, 8 Drawing Sheets

METHOD FOR ENHANCING THE RELIABILITY OF A P-CHANNEL SEMICONDUCTOR DEVICE AND A P-CHANNEL SEMICONDUCTOR DEVICE MADE THEREOF

CROSS REFERENCE TO RELATED APPLICATIONS

This application claims priority under 35 U.S.C. §119(e) to U.S. provisional patent application 61/250,409, filed on Oct. 9, 2009, which application is hereby incorporated by reference in its entirety.

BACKGROUND OF THE INVENTION

1. Field of the Invention

The present invention relates to the field of semiconductor devices, more particularly to the field of P-channel semiconductor devices. The present invention relates to enhancing reliability, more particularly negative bias temperature instability (NBTI) reliability, of such devices. Embodiments of the present invention are particularly useful for sub-1 nm EOT devices.

2. Description of the Related Technology

NBTI is a significant reliability concern for submicron CMOS technologies, particularly to the PMOS transistors therein. It is widely believed that NBTI degradation is due to generation of interface traps, which are unsaturated silicon dangling bonds. One of the most popular models explaining NBTI phenomenon is the reaction diffusion model. This model proposes that the generation of interface traps is because of a hole induced electrochemical reaction at the Si—SiO2 interface. In the initial times the degradation is reaction rate controlled, however, with time the phenomenon becomes diffusion limited. In addition to this, it is also believed that a consistent part of the NBTI degradation is due to a hole-trapping mechanism, whereby a hole gets trapped in a trap state, causing a shift in the threshold voltage.

NBTI has always been associated with the CMOS development, but it was not considered of great importance because of the low electric fields in operation. However, as there is an increasing demand for higher drive current, NBTI has become a major reliability problem for the semiconductor industry, in particular it is a key reliability issue in MOSFETs.

When a P-channel semiconductor device, such as a PMOSFET, is biased with negative gate voltages especially at elevated temperatures, i.e. normal operating conditions, degradation of main device parameters (threshold voltage, transconductance, drive current, subthreshold slope, etc.) is observed: NBTI manifests as an increase in the threshold voltage and a consequent decrease in drain current and transconductance. The mechanism is caused by holes interacting with defect precursors in the oxide and at the oxide/semiconductor interface.

Also the reduction of effective oxide thickness (EOT), which is one of the most efficient ways to improve MOSFET performance, enhances NBTI reliability problems due to increased oxide electric field ($E_{ox}$). For sub-1 nm EOT Si PFETs, 10 year lifetime can be guaranteed only at gate voltages much lower than the expected operating voltages (e.g., expected operating voltage $V_{DD}$=1 V; $|V_G-V_{th}|$=0.7 V for a $|V_{th}|$=0.3 V).

As such, what is desired is a system and method that can alleviate NBTI in P-channel semiconductor devices while improving circuit performance.

SUMMARY OF CERTAIN INVENTIVE ASPECTS

Certain inventive aspects relates to improvement on reliability for P-channel semiconductor devices.

Particular and preferred aspects of the invention are set out in the accompanying independent and dependent claims. Features from the dependent claims may be combined with features of the independent claims and with features of other dependent claims as appropriate and not merely as explicitly set out in the claims.

In a first aspect, the present invention provides a method for forming a P-channel semiconductor device with good NBTI reliability. The method comprises providing a P-channel semiconductor device comprising a P-channel layer, and a control electrode on the semiconductor P-channel layer comprising at least a gate dielectric layer. As all solid-state materials, the gate dielectric layer has a conduction band and a valence band, there being an energy bandgap between the conduction band and the valence band. The gate dielectric layer has an exponentially-shaped distribution of defect levels E(defect) in its energy bandgap, the exponentially-shaped distribution of defect levels having a lower concentration of defect levels at the center of the bandgap and a higher concentration of defect levels at the edges of the bandgap. Stated in other words, the density of defect levels in the gate dielectric layer is exponentially decreasing as a function of energy from the band edges of an adjacent layer. As inversion carrier injection into the distribution of defect levels takes place from the P-channel layer into the gate dielectric layer, the adjacent layer considered is the one adjacent to the gate dielectric layer at a same side of the gate dielectric layer as the P-channel layer. In certain embodiments of the present invention, the exponentially decreasing distribution of defect levels may be expressed as function of the energy of the band edges of the semiconductor P-channel layer itself. In alternative embodiments, the exponentially decreasing distribution of defect levels may be expressed as a function of the energy of the band edges of a capping layer between the P-channel layer and the gate dielectric layer.

The method according to certain embodiments of the present invention comprises selecting at least one parameter of the P-channel semiconductor device such that the inversion carrier injection into the distribution of defect levels occurs as close as possible to the center of the bandgap of a layer adjacent the gate dielectric layer at the side of the P-channel layer, i.e. so that the inversion carrier injection level does deviate from the energy level at the center of the bandgap of the adjacent layer with a value not more than about 49%, such as not more than about 40%, for example not more than about 20%, not more than about 10%, even not more than about 5% of that bandgap (in eV). The layer adjacent the gate dielectric layer at the side of the P-channel layer may be the P-channel layer itself, or optionally a capping layer.

In accordance with certain embodiments of the present invention, selecting at least one parameter of the P-channel semiconductor device such that the inversion carrier injection level does deviate from the energy level at the center of the bandgap of the adjacent layer with a value not more than about 49%, such as not more than about 40%, for example not more than about 20%, not more than about 10%, even not more than about 5% of that bandgap (in eV) may comprise selecting the thickness of the semiconductor P-channel layer between a few mono-layers and about 20 nm, for example between about 3 nm and 20 nm, for example between about 5 nm and 20 nm, such as between about 7 nm and 20 nm.

In accordance with embodiments of the present invention, where the semiconductor P-channel layer comprises a combination of at least two semiconductive elements, one of the semiconductive elements having a smaller bandgap than the others, selecting parameters of the P-channel semiconductor device such that the inversion carrier injection level does deviate from the energy level at the center of the bandgap of the adjacent layer with a value not more than about 49%, such as not more than about 40%, for example not more than about 20%, not more than about 10%, even not more than about 5% of that bandgap (in eV) may comprise selecting the concentration in the semiconductor P-channel layer of the semiconductive element with the smallest bandgap between about 25% and 99%. In certain embodiments, a method may comprise selecting the concentration in the semiconductor P-channel layer of the semiconductive element with the smallest bandgap higher than about 50%, for example higher than about 55%, e.g. higher than about 60%.

In accordance with certain embodiments of the present invention, where the P-channel semiconductor device comprises a semiconductor capping layer in between the semiconductor P-channel layer and the gate dielectric layer, selecting parameters of the P-channel semiconductor device such that the inversion carrier injection level does deviate from the energy level at the center of the bandgap of the adjacent layer with a value not more than about 49%, such as not more than about 40%, for example not more than about 20%, not more than about 10%, even not more than about 5% of that bandgap (in eV) may comprise selecting the thickness of the semiconductor capping layer between about 0.1 nm and 5 nm. In certain embodiments, a method may comprise selecting the thickness of the semiconductor capping layer about 2 nm or below, for example about 1.5 nm or below, about 1 nm or below, about 0.65 nm or below.

Hence a method according to certain embodiments of the present invention comprises selecting at least one parameter of the P-channel semiconductor device so as to obtain, compared to prior art methods, increased thickness of the P-channel layer, e.g. SiGe layer, and/or increased content of the smallest bandgap semiconductive element in the P-channel layer, e.g. increased Ge content in a SiGe layer, and/or decreased thickness of a capping layer, e.g. Si capping layer. It is to be noted that a decreased thickness of a capping layer, which is only optionally present, per se already yields good results in terms of NBTI reliability.

In a second aspect, the present invention provides a P-channel semiconductor device comprising a semiconductor P-channel layer, and a control electrode on the semiconductor P-channel layer. The control electrode comprises at least a gate dielectric layer, the gate dielectric layer having an exponentially-shaped distribution of defect levels E(defect) in its energy bandgap, the exponentially-shaped distribution of defect levels having a lower concentration of defect levels at the center of the bandgap and a higher concentration of defect levels at the edges of the bandgap. The density of defect levels in the gate dielectric layer is exponentially decreasing as a function of energy from the band edges of an adjacent layer. The adjacent layer may be the semiconductor P-channel layer itself, or alternatively the adjacent layer may be a capping layer provided between the semiconductor P-channel layer and the gate dielectric layer.

The P-channel semiconductor device has an inversion carrier injection into the distribution of defect levels which does deviate from the energy level at the center of the bandgap of the adjacent layer with a value not more than about 49%, such as not more than about 40%, for example not more than about 20%, not more than about 10%, even not more than about 5% of that bandgap (in eV).

In certain embodiments of the present invention, the P-channel layer comprises a combination of at least two semiconductive elements. As an example, the P-channel layer may be a SiGe layer.

In certain embodiments of the present invention, the thickness of the semiconductor P-channel layer, e.g. the thickness of the SiGe layer, is between about a few mono-layers and 20 nm, preferably higher than about 3 nm, for example between about 3 nm and 20 nm, for example between about 5 nm and 20 nm, such as between about 7 nm and 20 nm.

In certain embodiments of the present invention, where the P-channel layer comprises a combination of at least two semiconductive elements and one of the semiconductive elements has a smaller bandgap than the others, the concentration in the semiconductor P-channel layer of the semiconductive element with the smallest bandgap may be between about 25% and 99%, for example higher than about 50%, for example higher than about 55%, e.g. higher than about 60%.

In certain embodiments of the present invention, the P-channel semiconductor device may comprise a capping layer between the semiconductor P-channel layer and the gate dielectric layer, and the thickness of the capping layer may be about 2 nm or below, for example about 1.5 nm or below, about 1 nm or below, about 0.65 nm or below.

A P-channel semiconductor device according to certain embodiments of the present invention may have a sub-1 nm EOT.

Certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Figure 1:
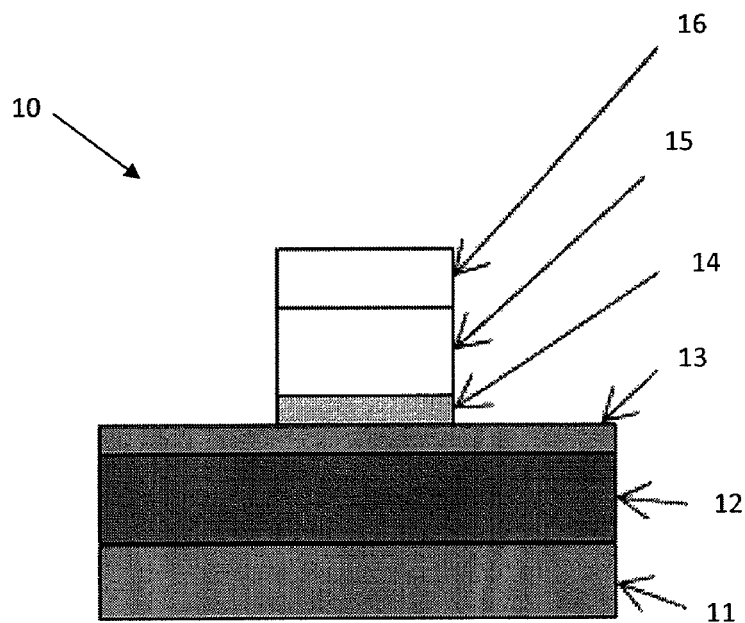
FIG. 1 illustrates a semiconductor device according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

One way to improve FET performance is by using a strained Si channel layer which incorporates Ge. In embodiments of the present disclosure, the NBTI reliability of, in particular, such SiGe devices is described. This is, however, intended to be an example only, and is not intended to be limiting for the invention.

NBTI stress experiments were performed on buried SiGe channel P-FETS using the extended-stress-measure technique as described by B. Kaczer et al. in Proc. IEEE IRPS, pp. 20-27, 2008, which is incorporated herein by reference in its entirety. The semiconductor devices under test and a band diagram of this type of semiconductor device in inversion are depicted in FIG. 1 and FIG. 2, respectively.

The semiconductor device 10, also called herein a P-channel semiconductor device, illustrated in FIG. 1 comprises a substrate 11, e.g. Si substrate, with a semiconductor P-channel layer 12 thereon, e.g. a SiGe P-channel layer. The semiconductor P-channel layer has a valence band energy level $E_v$(channel). The P-channel semiconductor device 10 furthermore comprises a gate dielectric layer 14, e.g. a $SiO_2$ layer, on the semiconductor P-channel layer 12. The gate dielectric layer 14 has a valence band energy level $E_v$(gate dielectric). The density of defect levels $E_t$ in the gate dielectric layer 14 as function of energy is assumed to be exponentially decreasing from the band edges of the adjacent layer (being the semiconductor P-channel layer 12 or optionally, if present, a capping layer 13 between the P-channel layer 12 and the gate dielectric layer 14) toward the center of the bandgap of this adjacent layer.

The channel-dielectric band offset $\Delta E_v$ towards a particular defect level at which charge carriers are injected from the channel into the dielectric is defined as $E_v$(channel)–$E_t$. The semiconductor device 10 may furthermore optionally comprise a capping layer 13, e.g. a Si cap, between the P-channel layer 12 and the gate dielectric layer 14 for having a good passivation of the interface, which is advantageous for device performance, a high-k dielectric layer 15, e.g. a $HfO_2$ dielectric layer, and a metal gate 16.

Figure 2:
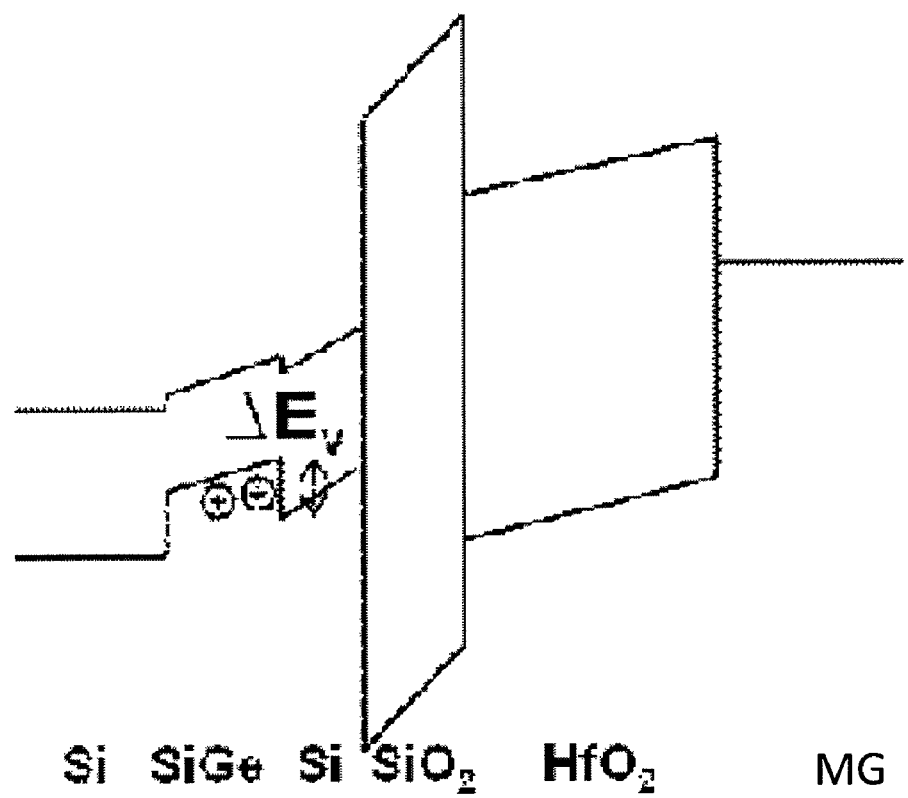
FIG. 2 schematically illustrates an energy band diagram corresponding to the semiconductor device illustrated in FIG. 1.

The corresponding energy band diagram is illustrated in FIG. 2 for an exemplary semiconductor device according to embodiments comprising a SiGe p-channel layer, a Si capping layer and a gate stack comprising a metal gate (MG), a $SiO_2$ dielectric layer and $HfO_2$ dielectric layer. The channel-dielectric band offset $\Delta E_v$ is indicated.

In accordance with embodiments of the present invention, the semiconductor device 10 is by purpose engineered such that the inversion carrier injection into the distribution of defect levels occurs as close as possible to the center of the bandgap of a layer adjacent the gate dielectric layer at the side of the P-channel layer (the semiconductor P-channel layer 12 itself or optionally the capping layer 13). Alternatively worded, in accordance with embodiments of the present invention, the inversion carrier injection level does deviate from the energy level at the center of the bandgap of the adjacent layer (the semiconductor P-channel layer 12 or optionally the capping layer 13) with a value not more than about 49%, such as not more than about 40%, for example not more than about 20%, not more than about 10%, even not more than about 5% of that bandgap (in eV). If this is the case, the gate dielectric defect energy level is actually decoupled from the majority carriers in the channel, which are holes as the channel under consideration is of P-type, because of the low concentration of defects at that energy level. In order to obtain this decoupling, in accordance with embodiments of the present invention, parameters of the semiconductor device 10 are selected such that holes from the semiconductor P-channel layer are prevented from interacting with the gate dielectric defect energy level. This may be obtained by engineering the semiconductor device such that the inversion carrier injection into the distribution of defect levels is so as to avoid interaction between carriers and a high concentration in the distribution of defect levels. This allows reducing NBTI (holes do not "see" the defect level). In particular, the closer the inversion carrier injection into the distribution of defect levels is to the center of the bandgap of the layer adjacent the gate dielectric layer at the side of the P-channel layer, the better the result in terms of NBTI reliability, as the center of the bandgap corresponds to the lowest distribution level (concentration) of charge traps. This way, an ad hoc optimization of semiconductor devices, for example SiGe semiconductor devices, provides a solution to the NBTI problem, in particular also for sub-1 nm EOT devices, thus significantly increasing operating overdrive voltages while still guaranteeing 10 year device lifetime.

Figure 3:
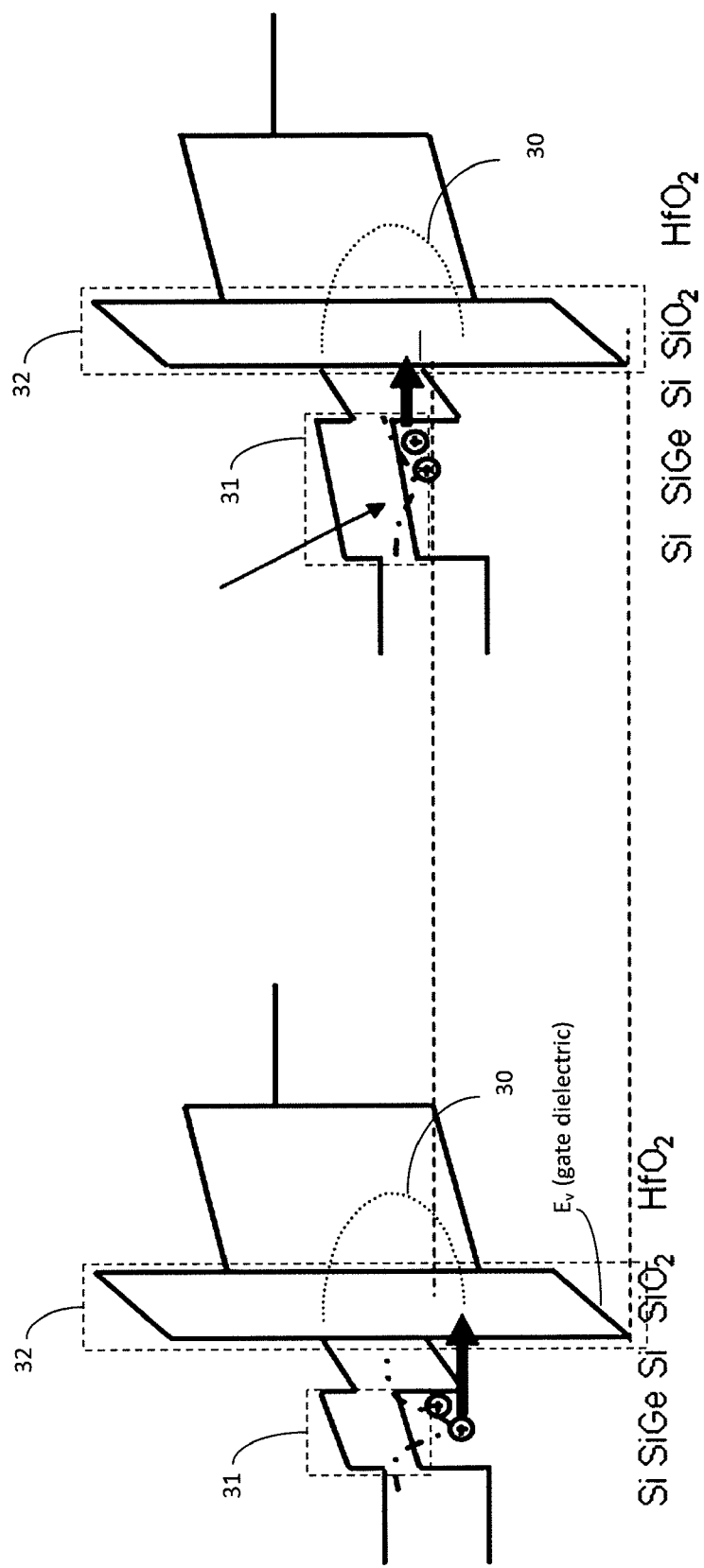
FIG. 3 illustrates energy band diagrams of a standard device and of a semiconductor device according to embodiments of the present invention with increased thickness of the semiconductor P-channel layer.

In one embodiment, selecting parameters of the P-channel semiconductor device such that the inversion carrier injection into the distribution of defect levels does deviate from the energy level at the center of the bandgap of the adjacent layer with a value not more than about 49%, such as not more than about 40%, for example not more than about 20%, not more than about 10%, even not more than about 5% of that bandgap (in eV) comprises increasing the thickness of the semiconductor P-channel layer 12. The energy band diagrams of this embodiment are illustrated in FIG. 3. The left hand side of FIG. 3 illustrates the energy band diagram of a standard SiGe semiconductor device, having a thinner semiconductor P-channel layer 12, while the right hand side of FIG. 3 illustrates the energy band diagram of a gate stack in accordance with embodiments of the present invention, where the thickness of the semiconductor P-channel layer 12 is increased. Suitable thicknesses of the semiconductor P-channel layer 12, in case the semiconductor P-channel layer is a SiGe layer, are between a few mono-layers and about 20 nm. This upper limit corresponds to the critical thickness for which the SiGe layer relaxes and loses its compressive strain. In FIG. 3, the defect level distribution responsible for NBTI is indicated by 30. This defect level distribution 30 corresponds to energy levels and corresponding defect concentrations for a specific example of a SiGe P-FET device. The energy bands of the semiconductor P-channel layer 12, indicated by 31 in FIG. 3, correspond to a specific example of a SiGe semiconductor P-channel with a particular $E_v$(channel) of a particular SiGe P-FET device. The energy bands of the gate dielectric layer 14, indicated by 32 in FIG. 3, correspond to a specific example of a $SiO_2$ gate dielectric layer with a valence band energy level $E_v$(gate dielectric) of a particular example of a SiGe P-FET device.

Figure 4:
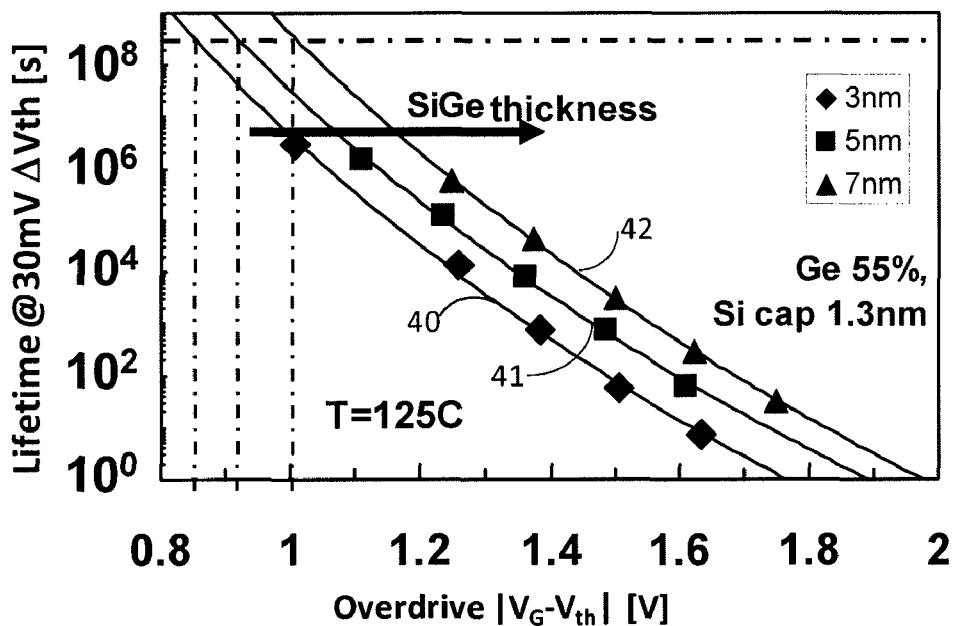
FIG. 4 shows graphs illustrating reduction of NBTI with increasing SiGe thickness.

It can be seen from FIG. 4 that increasing the thickness of the semiconductor P-channel layer 12, e.g. SiGe layer, has a positive impact on the NBTI reliability. FIG. 4 shows graphs setting out lifetime of devices in function of $|V_G-V_{th}|$. Lifetime is defined at that moment in time when the device exhibits a 30 mV shift in the threshold voltage $V_{th}$.

Graphs are set out for three different SiGe semiconductor devices: a first device with a SiGe layer of 3 nm thickness (graph 40), a second device with a SiGe layer of 5 nm thickness (graph 41) and a third device with a SiGe layer of 7 nm thickness (graph 42). The SiGe layer comprises Germanium as a smallest bandgap semiconductive element with a concentration of about 55%, the Si capping layers is about 1.3 nm thick. The first device, in order to have a lifetime of 10 years, cannot be allowed to have a $|V_G-V_{th}|$ larger than about 0.85 V. For the second device, the $|V_G-V_{th}|$ cannot be larger than about 0.92 V and for the third device, the $|V_G-V_{th}|$ should not be larger than 1.01 V in order for these to have a lifetime of 10 years. Hence, the larger the thickness of the semiconductor P-channel layer, the more the NBTI is reduced.

Figure 5:
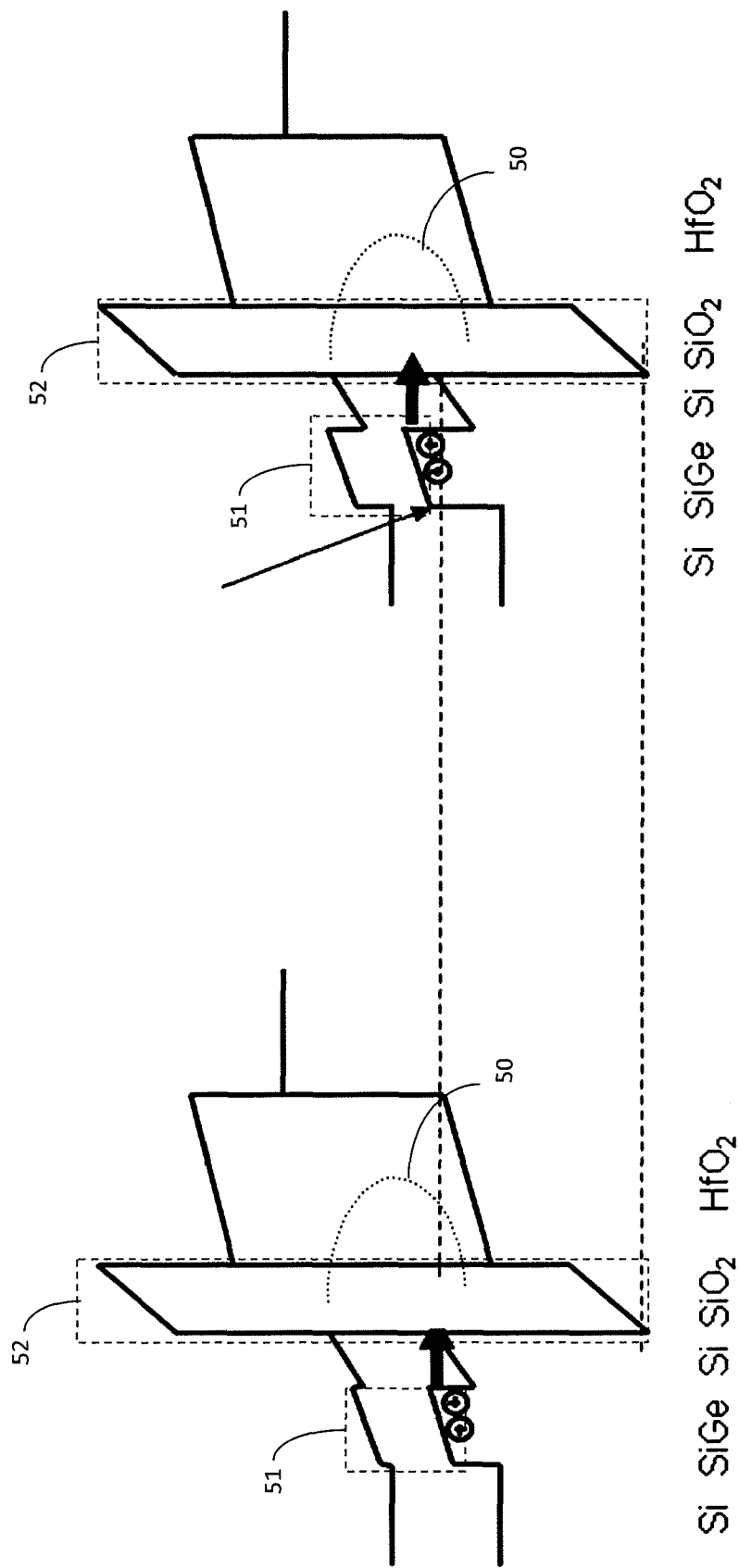
FIG. 5 illustrates energy band diagrams of a standard device and of a semiconductor device according to embodiments of the present invention with increased concentration of the semiconductive element of the semiconductor P-channel layer.

In another embodiment, selecting parameters of the P-channel semiconductor device such that the inversion carrier injection into the distribution of defect levels does deviate from the energy level at the center of the bandgap of the adjacent layer with a value not more than about 49%, such as not more than about 40%, for example not more than about 20%, not more than about 10%, even not more than about 5% of that bandgap (in eV) comprises increasing the fraction of the smallest bandgap semiconductive element of the semiconductor P-channel layer 12 in case the semiconductor P-channel layer 12 comprises a combination of semiconductive elements, e.g. the Ge concentration in the SiGe layer. The energy band diagrams of this embodiment are illustrated in FIG. 5. The left hand side of FIG. 5 illustrates the energy band diagram of a standard semiconductor device, having a lower fraction of the smallest bandgap semiconductive element in the semiconductor P-channel layer 12, while the right hand side of FIG. 5 illustrates the energy band diagram of a semiconductor device in accordance with embodiments of the present invention, where the fraction of the semiconductive element in the semiconductor P-channel layer 12 is increased. Suitable fractions of the semiconductive element in the semiconductor P-channel layer 12 are between about 25% and 99%, for example between about 45% and 75%, such as between about 55% and 65%. In FIG. 5, the defect level distribution responsible for NBTI is indicated by 50. This defect level distribution 50 corresponds to energy levels and corresponding defect concentrations for a specific example of a SiGe P-FET device. The energy bands of the semiconductor P-channel layer 12, indicated by 51 in FIG. 5, correspond to a specific example of a SiGe semiconductor P-channel with a particular $E_v$(channel) of a particular SiGe P-FET device. The energy bands of the gate dielectric layer 14, indicated by 52 in FIG. 5, correspond to a specific example of a SiO$_2$ gate dielectric layer with a valence band energy level $E_v$(gate dielectric) of a particular example of a SiGe P-FET device.

Figure 6:
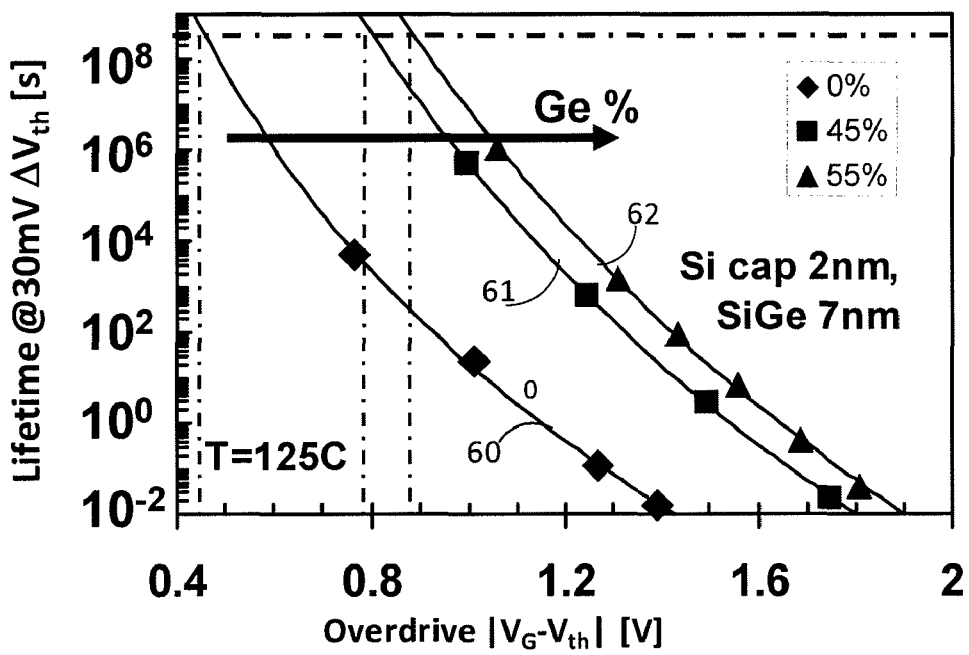
FIG. 6 shows graphs illustrating reduction of NBTI with increased concentration of the semiconductive element of the semiconductor P-channel layer.

It can be seen from FIG. 6 that increasing the concentration of the smallest bandgap semiconductive element of the semiconductor P-channel layer 12, in the embodiment illustrated e.g. increasing the Ge content in a SiGe layer, has a positive impact on the NBTI reliability. FIG. 6 shows graphs setting out lifetime of devices in function of $|V_G-V_{th}|$. Lifetime is defined at that moment in time when the device exhibits a 30 mV shift in the threshold voltage $V_{th}$.

Graphs are set out for three different semiconductor devices: a fourth device with a Ge content in the SiGe layer of 0% (graph 60), a fifth device with a Ge content in the SiGe layer of 45% (graph 61) and a sixth device with a Ge content in the SiGe layer of 55% (graph 62). The thickness of the SiGe layer is about 7 nm and the thickness of the Si capping layer is about 2 nm. The fourth device, in order to have a lifetime of 10 years, cannot be allowed to have a $|V_G-V_{th}|$ larger than 0.46 V. For the fifth device, the $|V_G-V_{th}|$ cannot be larger than 0.8 V and for the sixth device, the $|V_G-V_{th}|$ should not be larger than 1.01 V in order for it to have a lifetime of 10 years. Hence, the larger the fraction of the smallest bandgap semiconductive material in the semiconductor P-channel layer 12, e.g. the larger the Ge content in the SiGe layer, the more the NBTI is reduced.

Figure 7:
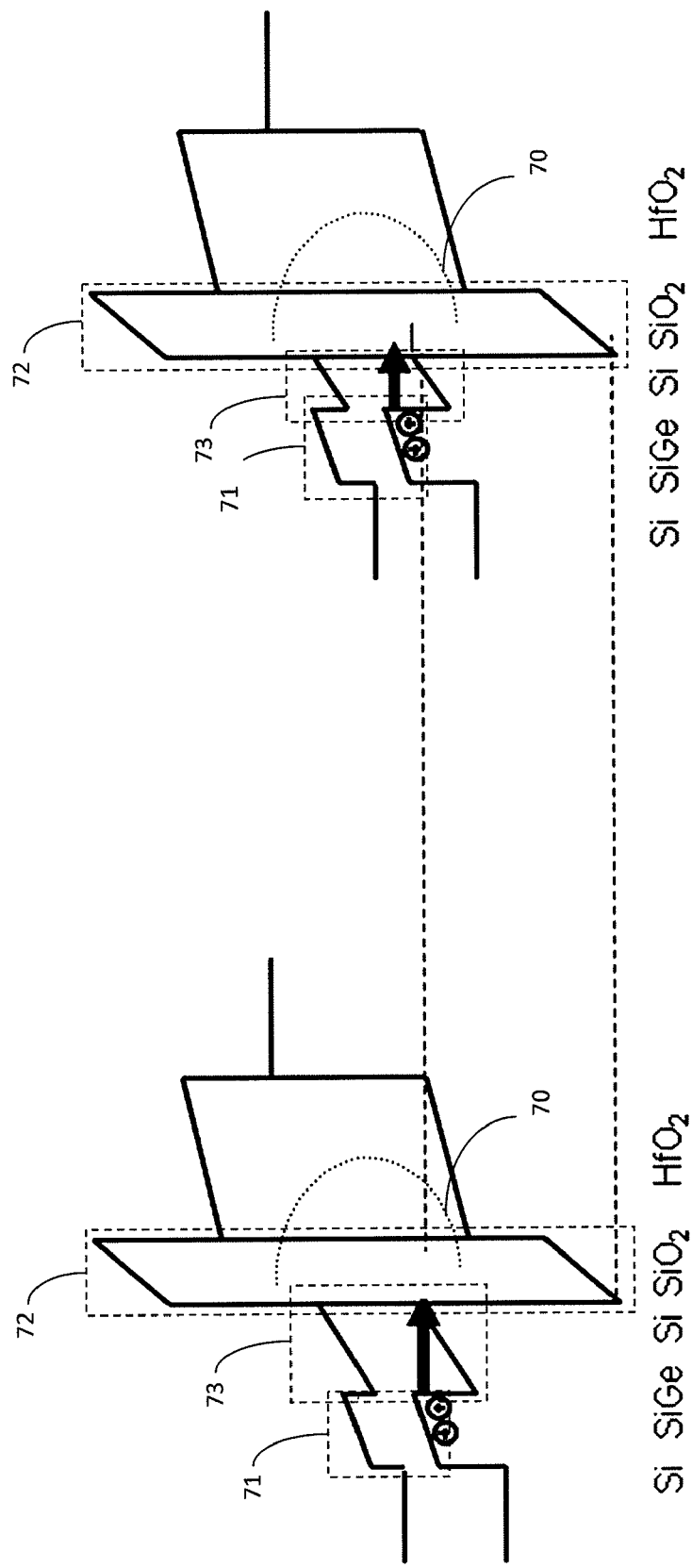
FIG. 7 illustrates energy band diagrams of a standard device and of a semiconductor device according to embodiments of the present invention with decreased thickness of a capping layer between the semiconductor P-channel layer and the gate dielectric.

In yet another embodiment, selecting parameters of the P-channel semiconductor device such that the inversion carrier injection into the distribution of defect levels does deviate from the energy level at the center of the bandgap of the adjacent layer with a value not more than about 49%, such as not more than about 40%, for example not more than about 20%, not more than about 10%, even not more than about 5% of that bandgap (in eV) comprises decreasing the thickness of the capping layer 13 on the semiconductor P-channel layer 12, e.g. the Si capping layer thickness. The energy band diagrams of this embodiment are illustrated in FIG. 7. The left hand side of FIG. 7 illustrates the energy band diagram of a standard semiconductor device, having a thicker capping layer, while the right hand side of FIG. 7 illustrates the energy band diagram of a semiconductor device in accordance with embodiments of the present invention, having a thinner capping layer. Suitable thicknesses of the capping layer are between about 0 nm and 5 nm, e.g. between about 0.1 nm and 5 nm, such as between about 0.65 nm and 3 nm. In FIG. 7, the defect level distribution responsible for NBTI is indicated by 70. This defect level distribution 70 corresponds to energy levels and corresponding defect concentrations for a specific example of a SiGe P-FET device. The energy bands of the semiconductor P-channel layer 12, indicated by 71 in FIG. 7, correspond to a specific example of a SiGe semiconductor P-channel with a particular $E_v$(channel) of a particular SiGe P-FET device. The energy bands of the gate dielectric layer 14, indicated by 72 in FIG. 7, correspond to a specific example of a SiO$_2$ gate dielectric layer with a valence band energy level $E_v$(gate dielectric) of a particular example of a SiGe P-FET device. The energy bands of the capping layer 13, indicated by 73 in FIG. 7, correspond to a specific example of a Si capping layer.

Figure 8:
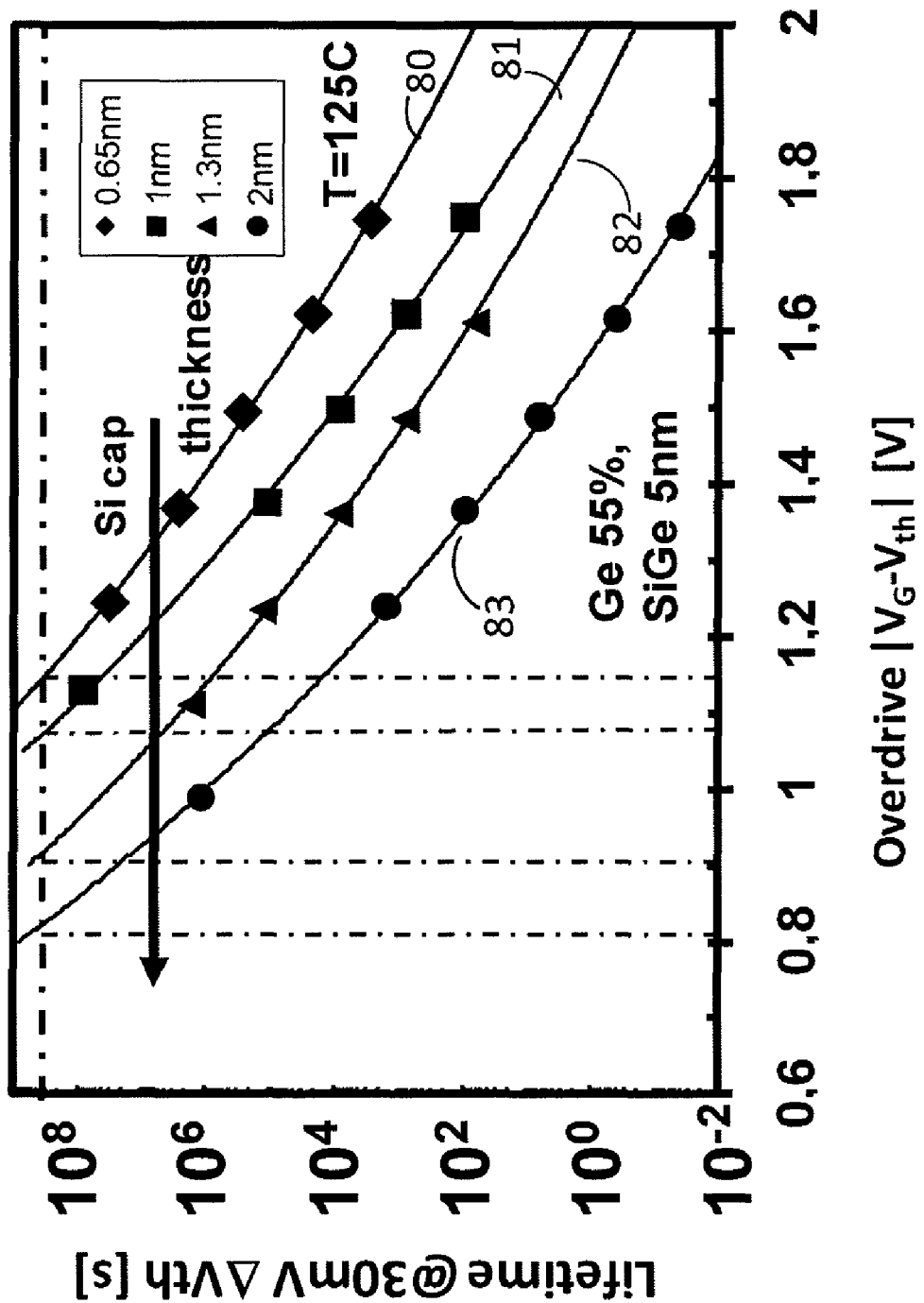
FIG. 8 shows graphs illustrating reduction of NBTI with decreased thickness of a capping layer between the semiconductor P-channel layer and the gate dielectric.

It can be seen from FIG. 8 that decreasing the thickness of the cap, e.g. decreasing the Si cap thickness, has a positive impact on the NBTI reliability. FIG. 8 shows graphs setting out lifetime of devices in function of $|V_G-V_{th}|$. Lifetime is defined at that moment in time when the device exhibits a 30 mV shift in the threshold voltage $V_{th}$.

Graphs are set out for four different devices: a seventh device with a Si cap thickness of 0.65 nm (graph 80), an eighth device with a Si cap thickness of 1 nm (graph 81), a ninth device with a Si cap thickness of 1.3 nm (graph 82) and a tenth device with a Si cap thickness of 2 nm (graph 83). In the embodiments illustrated, the Ge content of the SiGe layer is about 55%. The thickness of the SiGe layer is about 5 nm. The tenth device, in order to have a lifetime of 10 years, cannot be allowed to have a $|V_G-V_{th}|$ larger than 0.81 V. For the ninth device, the $|V_G-V_{th}|$ cannot be larger than 0.9 V, for the eighth device, the $|V_G-V_{th}|$ cannot be larger than 1.08 V and for the seventh device, the $|V_G-V_{th}|$ should not be larger than 1.15 V in order for these to have a lifetime of 10 years. Hence, the smaller the cap thickness, e.g. the thinner the Si cap, the more the NBTI is reduced. Nevertheless, using no Si cap when using a SiGe channel layer leads to very bad interface passivation. The NBTI reliability of the device would still be good, but the device performance would be poor. Hence a trade-off between device passivation and NBTI reliability needs to be made.

Experiments

An example of a P-channel semiconductor device according to embodiments of the present invention may be a SiGe-channel P-FET comprising a Si capping layer in between the buried SiGe channel layer and a $SiO_2$ gate dielectric layer. More details for this example are presented hereinafter.

NBTI stress experiments were performed on buried SiGe channel P-FETS using the extended-stress-measure technique as described by B. Kaczer et al. in Proc. IEEE IRPS, pp. 20-27, 2008. The gate stack of devices under test and a band diagram of this type of stack in inversion are depicted in FIG. 1 and FIG. 2, respectively. Three major parameters were varied separately in order to assess their impact on NBTI reliability, i.e. the Ge concentration, the SiGe layer thickness and the Si cap thickness. Ge content varied from 0% (pure Si channel reference) up to 55%; SiGe layer thickness varied between 3 and 7 nm; Si cap thickness after oxidation, as estimated by C-V curves and TEM pictures, varied between 0.65 and 2 nm. It should be noted that the thickness of the Si cap impacts the EOT and $C_{ox}$ values, and hence a fixed overdrive voltage leads to different oxide electric fields $E_{ox}$ for different devices. This may affect interpretation of NBTI data. So, to have a more fair comparison, degradation ($\Delta N_{eff} = \Delta V_{th} * C_{ox}/q$) should be compared as a function of the equivalent $E_{ox}$ for different Si thicknesses. Having two dielectrics ($SiO_2$ and high-k $HfO_2$), the electric field is different on each of these. An equivalent $E_{ox}$ is calculated from the EOT, equivalent to the $E_{ox}$ that a $SiO_2$ dielectric with thickness equal to the EOT of the stack would experience. Equivalent $E_{ox}$ extraction is not trivial for such complex gate stacks. For the experiments it has been extracted with the following method in order to be on a safe side: Q-V curve is obtained integrating C-V curve; a line is fitted to the linear part of the Q-V curve; the slope of the line represents the extracted $C_{ox}$; EOT is calculated from $C_{ox}$; finally the equivalent $E_{ox}$ is calculated as $|V_G - V_{th}|/EOT$.

Figure 9:
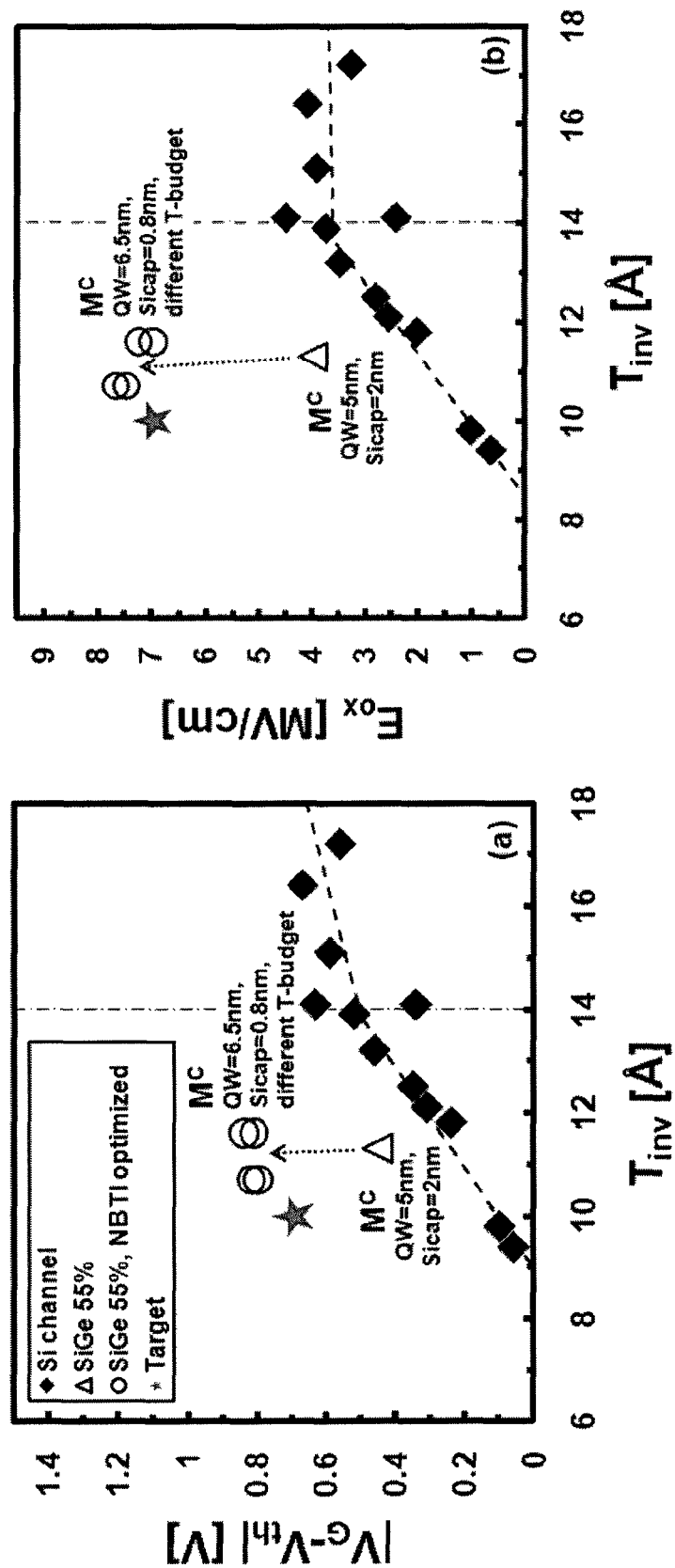
FIG. 9 illustrates principles for one embodiment applied to low-EOT devices.

A wide set of experiments were performed on SiGe p-FETS changing only one of the semiconductor device parameters (i.e. the concentration of the semiconductive element and/or the thickness of the channel layer and/or the thickness of the capping layer) under investigation at the time, while fixing the other two. The following observations are made:

1) As is shown in FIG. 6, the introduction of semiconductive material in the channel, the semiconductive material having a bandgap smaller than the bandgap of the original channel material, e.g. introduction of Ge in a Si channel, dramatically improves the NBTI reliability. Extrapolated operating overdrive voltage for 10 years lifetime ($\Delta V_{op}$) assuming 30 mV threshold voltage shift ($\Delta V_{th}$) at 125° C. criterion, increases from 0.46 V for the pure Si reference up to 0.92 V for 55% Ge concentration.
2) Increasing the thickness of the P-type channel material, e.g. SiGe layer, has also a positive impact on the NBTI reliability (FIG. 4): $V_{op}$ increases from 0.85 V up to 1.01 V when moving from a 3 nm thick SiGe layer to a 7 nm thick one.
3) The capping layer, e.g. Si cap, has also an important impact on NBTI reliability (FIG. 8). A thicker capping layer, e.g. Si cap, clearly degrades the NBTI performance. $V_{op}$ moves between 0.83 V and 1.13 V as a function of the Si cap thickness. To exclude the effect of varying EOT, FIG. 9 shows the degradation ($\Delta N_{eff} = \Delta V_{th} * C_{ox}/q$) vs. $E_{ox}$. It can be seen that the impact of the Si cap thickness is not an artifact due to different EOT.

Surprisingly, embodiments of the present invention apply also to ultra-thin EOT semiconductor devices, e.g. semiconductor devices with an EOT below 1 nm. This is absolutely not trivial, since ultra-thin EOT devices are implemented by consumption of the gate dielectric interfacial layer, e.g. $SiO_2$ layer, which is known to be detrimental for reliability.

In a particular experiment, a 6 Å EOT $Si_{0.45}Ge_{0.55}$ P-FET with 10 year lifetime at operating conditions ($V_{DD}$=1 V) has been demonstrated. Ultra-thin EOT is achieved by interfacial layer (IL) scavenging. NBTI is alleviated using a high Ge fraction, a thick SiGe quantum well (QW) and a thin Si capping layer as set out above.

In particular the Si capping layer has a considerable impact on the NBTI reliability with thinner capping layers enhancing the lifetime. EOT reduction by IL scavenging degrades the NBTI reliability faster than high-k scaling. In particular, there is an additional reliability deterioration on top of that caused by the electric field increase due to EOT scaling (maximum operating Eox vs. $T_{inv}$ would stay constant as observed for thick EOT Si devices).

FIG. 9 illustrates that a high Ge fraction (55%) and a thick SiGe layer (6.5 nm) combined with the use of a thin Si cap (0.8 nm) boost NBTI lifetime to meet the target condition ($|V_G-V_{th}|$=0.7 V at $T_{inv}$=10 Å, EOT ~6 Å) on devices implementing aggressive IL scavenging.

Figure 10:
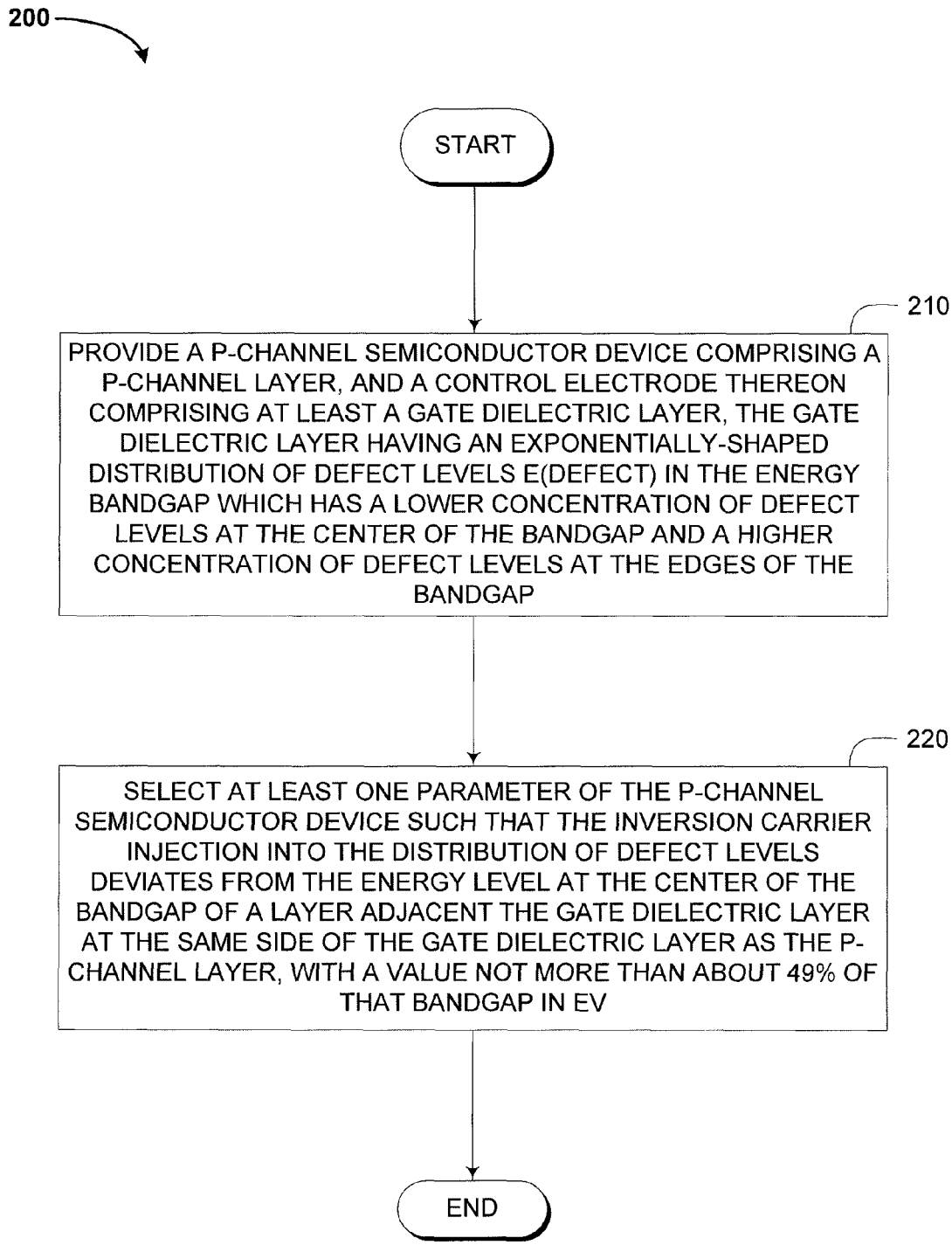
FIG. 10 shows a flowchart of one embodiment of a method of forming a P-channel semiconductor device with good negative bias temperature instability (NBTI) reliability.

FIG. 10 shows a flowchart of one embodiment of a method of forming a P-channel semiconductor device with good negative bias temperature instability (NBTI) reliability. The method 200 starts at a block 210, wherein a P-channel semiconductor device is provided. The device comprises a P-channel layer, and a control electrode on the semiconductor P-channel layer comprising at least a gate dielectric layer. The gate dielectric layer has an exponentially-shaped distribution of defect levels E(defect) in the energy bandgap. The exponentially-shaped distribution of defect levels has a lower concentration of defect levels at the center of the bandgap and a higher concentration of defect levels at the edges of the bandgap. Moving to a block 220, wherein at least one parameter of the P-channel semiconductor device is selected such that the inversion carrier injection into the distribution of defect levels deviates from the energy level at the center of the bandgap of a layer adjacent the gate dielectric layer at the same side of the gate dielectric layer as the P-channel layer, with a value not more than about 49% of that bandgap in eV.

The foregoing embodiments of methods are embodied in the form of various discrete blocks. In one embodiment, the functions of any one or more of those blocks may be realized, for example, by one or more appropriately programmed processors or devices.

It is to be noted that the processor or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product stored in a computer-readable medium for execution by a programmable processor. Method steps of aspects of the invention may be performed by a programmable processor executing instructions to perform functions of those aspects of the invention, e.g., by operating on input data and generating output data. Accordingly, the embodiment includes a computer program product which provides the functionality of any of the methods described above when executed on a computing device. Further, the embodiment includes a data carrier such as for example a CD-ROM or a diskette which stores the computer product in a machine-readable form and which executes at least one of the methods described above when executed on a computing device.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of forming a P-channel semiconductor device with good negative bias temperature instability (NBTI) reliability, the method comprising:
   providing a P-channel semiconductor device comprising a P-channel layer, and a control electrode on the semiconductor P-channel layer comprising at least a gate dielectric layer, the gate dielectric layer having an exponentially-shaped distribution of defect levels E(defect) in the energy bandgap, the exponentially-shaped distribution of defect levels having a lower concentration of defect levels at the center of the bandgap and a higher concentration of defect levels at the edges of the bandgap; and
   selecting at least one parameter of the P-channel semiconductor device such that the inversion carrier injection into the distribution of defect levels deviates from the energy level at the center of the bandgap of a layer adjacent the gate dielectric layer at the same side of the gate dielectric layer as the P-channel layer, with a value not more than about 49% of that bandgap in eV.

2. The method according to claim 1, wherein selecting at least one parameter of the P-channel semiconductor device comprises selecting the thickness of the semiconductor P-channel layer between about a few mono-layers and 20 nm.

3. The method according to claim 2, wherein selecting at least one parameter of the P-channel semiconductor device comprises selecting the thickness of the semiconductor P-channel layer to be higher than about 3 nm.

4. The method according to claim 1, wherein the semiconductor P-channel layer comprises a combination of at least two semiconductive elements, one of the semiconductive elements having a smaller bandgap than the other, wherein selecting parameters of the P-channel semiconductor device comprises selecting the concentration in the semiconductor P-channel layer of the semiconductive element with the smallest bandgap to be between about 25% and 99%.

5. The method according to claim 4, wherein selecting at least one parameter of the P-channel semiconductor device comprises selecting the concentration in the semiconductor P-channel layer of the semiconductive element with the smallest bandgap to be higher than about 50%.

6. The method according to claim 1, wherein the P-channel semiconductor device comprises a semiconductor capping layer in between the semiconductor P-channel layer and the gate dielectric layer, wherein selecting parameters of the P-channel semiconductor device comprises selecting the thickness of the semiconductor capping layer to be between about 0.1 nm and 5 nm.

7. The method according to claim 6, wherein selecting at least one parameter of the P-channel semiconductor device comprises selecting the thickness of the semiconductor capping layer to be 2 nm or below.

8. The method according to claim 1, wherein the process of selecting at least one parameter of the P-channel semiconductor device is performed by at least one computing device.

9. The method according to claim 1, wherein the P-channel semiconductor device has an effective oxide thickness (EOT) lower than 1 nm.

10. The method according to claim 1, wherein the P-channel layer comprises a SiGe layer.

11. A P-channel semiconductor device comprising:
    a semiconductor P-channel layer; and
    a control electrode on the semiconductor P-channel layer comprising at least a gate dielectric layer, the gate dielectric layer having an exponentially-shaped distribution of defect levels E(defect) in the energy bandgap, the exponentially-shaped distribution of defect levels having a lower concentration of defect levels at the center of the bandgap and a higher concentration of defect levels at the edges of the bandgap,
    wherein the P-channel semiconductor device has an inversion carrier injection into the distribution of defect levels which deviates from the energy level at the center of the bandgap of a layer adjacent the gate dielectric layer at the same side of the gate dielectric layer as the P-channel layer, with a value not more than about 49% of that bandgap in eV.

12. The P-channel semiconductor device according to claim 11, wherein the P-channel layer comprises a combination of at least two semiconductive elements.

13. The P-channel semiconductor device according to claim 12, wherein the P-channel layer is a SiGe layer.

14. The P-channel semiconductor device according to claim 12, wherein one of the semiconductive elements has a smaller bandgap than the other, wherein the concentration in the semiconductor P-channel layer of the semiconductive element with the smallest bandgap is between about 25% and 99%.

15. The P-channel semiconductor device according to claim 14, wherein the concentration in the semiconductor P-channel layer of the semiconductive element with the smallest bandgap is higher than about 50%.

16. The P-channel semiconductor device according to claim 11, wherein the P-channel semiconductor device comprises a capping layer between the semiconductor P-channel layer and the gate dielectric layer, wherein the thickness of the capping layer is between about 0.1 nm and 5 nm.

17. The P-channel semiconductor device according to claim 16, wherein the thickness of the capping layer is about 2 nm or below.

18. The P-channel semiconductor device according to claim 11, wherein the device has a sub-1 nm effective oxide thickness (EOT).

19. The P-channel semiconductor device according to claim 11, wherein the thickness of the semiconductor P-channel layer is between about a few mono-layers and 20 nm.

20. The P-channel semiconductor device according to claim 11, wherein the thickness of the semiconductor P-channel layer is higher than about 3 nm.

* * * * *